United States Patent [19]
Nagai et al.

[11] Patent Number: 4,829,023
[45] Date of Patent: May 9, 1989

[54] METHOD OF PRODUCING A SEMICONDUCTOR LASER

[75] Inventors: Yutaka Nagai; Yutaka Mihashi; Tetsuya Yagi; Yoichiro Ota, All of Itami, Japan

[73] Assignee: Mitsubishi Denki Kabushiki Kaisha, Japan

[21] Appl. No.: 126,501

[22] Filed: Nov. 30, 1987

[30] Foreign Application Priority Data

Dec. 2, 1986 [JP] Japan .................................. 61-288434

[51] Int. Cl.$^4$ ...................... H01L 7/00; H01L 21/208
[52] U.S. Cl. ............................. 437/129; 148/DIG. 17; 148/DIG. 56; 148/DIG. 95; 148/DIG. 118; 437/133; 437/946; 437/939; 156/612; 357/17
[58] Field of Search ................... 148/DIG. 17, 24, 56, 148/65, 72, 97, 110, 118, 122, 169, 95; 156/610–614; 357/16, 17, 18; 437/85, 90, 126, 129, 133, 939, 946, 949

[56] References Cited

U.S. PATENT DOCUMENTS

| | | | |
|---|---|---|---|
| 3,859,178 | 1/1975 | Logan et al. | 437/129 |
| 3,920,491 | 11/1975 | Yonezu | 357/17 |
| 3,974,002 | 8/1976 | Casey, Jr. et al. | 437/133 |
| 4,169,997 | 10/1979 | Logan et al. | 357/17 |
| 4,190,813 | 2/1980 | Logan et al. | 357/18 |
| 4,269,635 | 5/1981 | Logan et al. | 437/129 |
| 4,567,060 | 1/1986 | Hayakawa et al. | 437/133 |
| 4,734,385 | 3/1988 | Mihashi et al. | 437/129 |

FOREIGN PATENT DOCUMENTS

| | | |
|---|---|---|
| 0031808 | 7/1981 | European Pat. Off. |
| 0155152 | 9/1985 | European Pat. Off. |
| 0124051 | 4/1987 | European Pat. Off. |
| 60-217689 | 10/1985 | Japan |

OTHER PUBLICATIONS

Mihashi et al., "A Novel Self—Aligned AlGaAs Laser with Bent Active Layer Grown by MOCVD", Tech, Dig. of The International Electron Devices Meeting, Wash. DC., 1st–4th, Dec. 1985, pp. 646–649, IEEE, N.Y.

"A Novel Self—Aligned Laser with Small Astigmatism Grown by MO—CVD", 17th Conf. On Solid State Devices and Materials, Tokyo, 1985, pp. 63 to 66.

Primary Examiner—Brian E. Hearn
Assistant Examiner—William D. Bunch
Attorney, Agent, or Firm—Leydig, Voit & Mayer

[57] ABSTRACT

A method for producing a semiconductor laser including successively growing at least two semiconductor layers simultaneously on a substrate, the finally grown layer not containing aluminum and the layer grown immediately before the finally grown layer containing aluminum, etching a stripe groove through the finally grown layer to expose part of the semiconductor layer containing aluminum, growing a second semiconductor layer not including aluminum on the finally grown layer and the exposed surface of the semiconductor layer containing aluminum, and growing a semiconductor layer including aluminum on the second semiconductor layer not containing aluminum.

6 Claims, 1 Drawing Sheet

METHOD OF PRODUCING A SEMICONDUCTOR LASER

FIELD OF THE INVENTION

The present invention relates to a method of producing a semiconductor laser and, more particularly, to a production method that results in highly reproducible, highly reliable semiconductor lasers.

BACKGROUND OF THE INVENTION

A prior art SBA laser was reported by Mihashi et al in the Extended Abstracts of the 17th Conference on Solid State Devices and Materials, Tokyo, 1985, pages 63–66, and is shown in FIG. 2.

FIG. 2 shows a cross-sectional view of an SBA (Self aligned laser with Bent Active layer) laser that is produced by the metal organic vapor deposition (MO-CVD) method.

In this figure, the reference numeral 1 designates a p type GaAs substrate, the reference numeral 2 designates a buffer layer comprising p type $Al_{0.43}Ga_{0.57}As$, the reference numeral 3 designates a current blocking layer comprising n type GaAs, the reference numeral 5 designates a first cladding layer comprising p type $Al_{0.43}Ga_{0.57}As$, the reference numeral 6 designates an active layer comprising undoped $Al_{0.07}Ga_{0.93}As$, the reference numeral 7 designates a second cladding layer comprising n type $Al_{0.43}Ga_{0.57}As$, the reference numeral 8 designates a contact layer comprising n type GaAs, the reference numeral 9 designates an absorbed oxygen film, the reference numeral 10 designates a stripe groove which is produced in a reverse trapezoid cross section at the current blocking layer 3. The reference numeral 11 designates an active region, the reference numerals 12 and 13 designate an n electrode and a p electrode fixed to the contact layer 8 and the substrate 1, respectively.

The method of producing this SBA laser will be described briefly.

At first, a buffer layer 2 and a current blocking layer 3 are grown on the substrate 1 by MO-CVD method in a first crystal growth. After the growth, a stripe groove 10 having a reverse trapezoid cross section is produced at the current blocking layer 3 using an etchant for selectively etching only GaAs. As a result of this selective etching, the buffer layer 2 comprising p type $Al_{0.43}Ga_{0.57}As$ is exposed at the bottom of the stripe groove. Next, in the second crystal growth using MO-CVD method a first cladding layer 5, an active layer 6, a second cladding layer 7, and a contact layer 8 are grown successively on the wafer having the stripe groove 10. After the second crystal growth, an n type electrode 12 and a p type electrode 13 are produced on the contact layer 8 and at the surface of the substrate 1, respectively, by a method of such as vapor plating or sputtering, thereby completing a SBA laser.

In this SBA laser, a current flows through the stripe groove 10 produced at the current blocking layer 3, and the portion parallel with the substrate 1 positioned above the stripe groove 10 of the active layer 6 becomes an active region 11. Furthermore, by using a MO-CVD method, the active layer 6 can be bent in a configuration close to that of the stripe groove 10. In this bent portion, there arises a refractive index difference in the transverse direction, and thus light is efficiently confined in the transverse direction, thereby resulting in a low threshold current and a high efficiency.

In this prior art method of producing an SBA laser, a buffer layer 2 comprising p type $Al_{0.43}Ga_{0.57}As$ is exposed at the bottom of the stripe groove 10 by the etching to form the stripe groove 10. Meanwhile, as Al has a nature to be easily combined with oxygen, a thin oxide layer is produced at the surface of the buffer layer 2 by the etching or a water washing process. Further, buffer layer 2 is exposed to the air until a second crystal growth is conducted so that oxidation proceeds with the passage of time. Generally the oxide film is not a solid one, and almost all of it is dissociated and removed when the temperature is increased for subsequent crystal growth by the MO-CVD method. However, occasionally a quite thin oxide layer remains locally, or an absorbed oxygen film 9 resulting from a high concentration of oxygen combined with aluminum, remains even if an oxide layer is not formed.

Oxygen is taken into the crystal when a first cladding layer 5 comprising p type $Al_{0.43}Ga_{0.57}As$ is directly grown on the buffer layer 2, thereby producing a high resistance layer including oxygen which adversely affects crystallinity. Such a reduction in crystallinity and production of a high resistance layer harm the reproducibility of the laser characteristics and may increase the threshold current and operational current. Furthermore, the temperature rise of the laser during operation is increased, thereby inviting deterioration of the laser, adversely affecting reliability.

SUMMARY OF THE INVENTION

It is an object of the present invention to provide a method of producing a semiconductor laser having operating characteristics and reliability that are not adversely affected by oxidation of a stripe groove produced by etching.

Other objects and advantages of the present invention will become apparent from the detailed description given hereinafter; it should be understood, however, that the detailed description and specific embodiment are given by way of illustration only, since various changes and modifications within the spirit and scope of the invention will become apparent to those skilled in the art from this detailed description.

According to the present invention, a stripe groove is produced by selective etching of a grown semiconductor layer including Al and growing, and a semiconductor layer including Al via semiconductor layer including no Al on the layer containing Al. The production of a high resistance layer having poor crystallinity is prevented in the second crystal growth so that semiconductor lasers superior in reproducibility and reliability are obtained.

DETAILED DESCRIPTION OF THE PREFERRED EMBODIMENTS

Figure 1:
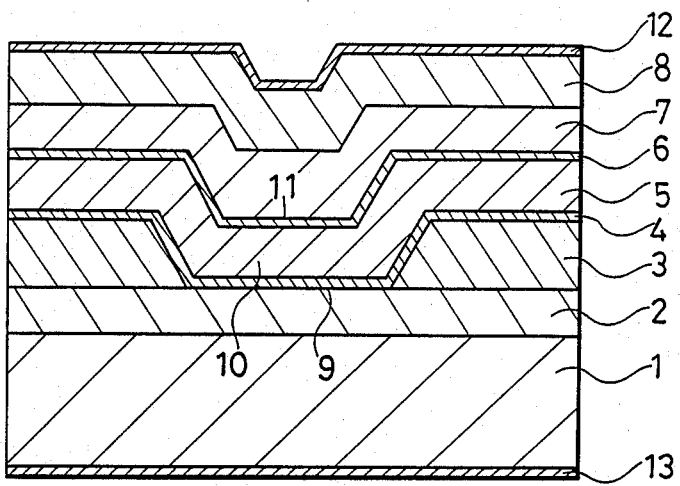
FIG. 1 is a diagram showing a cross-section of a semiconductor laser produced by a method as a first embodiment of the present invention.
Figure 2:
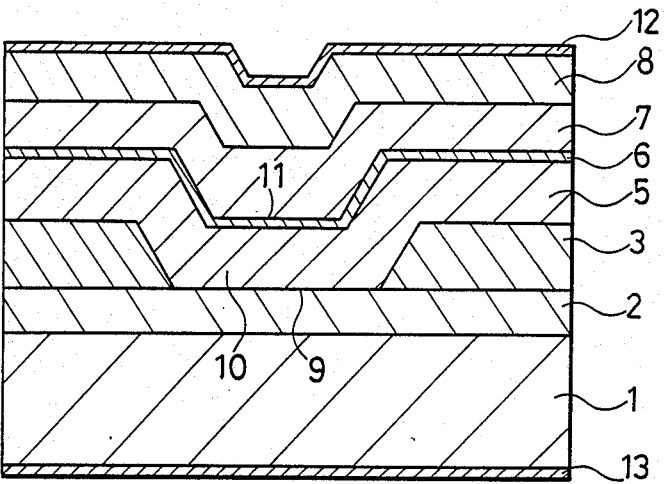
FIG. 2 is a diagram showing a cross-section of a prior art semiconductor laser.

FIG. 1 shows a semiconductor laser produced by a method as an embodiment of the present invention. In FIG. 1, the same reference numerals designate the same elements as those shown in FIG. 2. The reference numeral 4 designates a buffer layer comprising p type GaAs as a semiconductor layer including no Al.

Next, the production method will be described.

At first, in the first crystal growth a buffer layer 2 and a current blocking layer 3 are successively grown on the substrate 1. After the growth, a stripe groove 10 is produced by a photolithography technique and an etching in a similar manner to that in the prior art method. Since the buffer layer 2 is exposed by this etching, an absorbed oxygen film 9 combined with Al is produced at the surface thereof. A buffer layer 4, a first cladding layer 5, an active layer 6, a second cladding layer 7, and a contact layer 8 are successively grown thereon in the second crystal growth. After the growth of these layers, an n type electrode 12 and a p type electrode 13 are deposited on the contact layer 8 and at the surface of the substrate 1, respectively, by vapor plating or sputtering. The thickness of the buffer layer 4 is preferably larger than 0.01 μm and less than the depth of the stripe groove 10, that is, the thickness of the current blocking layer 3.

In the novel method, in a similar manner to that in the prior art method, a high concentration oxygen is absorbed by the surface of the buffer layer 2 or an oxide film is produced thereon by etching or water washing when the stripe groove 10 is formed. Furthermore, the buffer layer 2 at the bottom of the groove is also exposed to the outside air after the stripe groove 10 is produced, thereby allowing oxygen absorption. The absorbed oxygen film 9 remains at the start of the second crystal growth.

In the present invention, however, since a buffer layer 4 comprising p type GaAs is grown on the buffer layer 2 before growing a first cladding layer 5 comprising p type $Al_{0.43}Ga_{0.57}As$, the production of a high resistance layer at the beginning of the second crystal growth is suppressed. This is because less of the oxygen absorbed at the buffer layer 2 is taken into the buffer layer 4 since that layer does not include Al that is easily oxidized. This makes it possible to obtain a semiconductor laser having a good characteristics.

As is evident from the foregoing description, according to the present invention a stripe groove is produced by selectively etching a semiconductor layer which is obtained by a first crystal growth, a semiconductor layer including Al is thus exposed, and a semiconductor layer not including Al is grown on the semiconductor layer including Al before another semiconductor layer including Al is grown. Therefore, the production of a high resistance layer having poor crystallinity is prevented, and thus semiconductor lasers superior in reproducibility and reliability are obtained.

What is claimed is:

1. A method for producing a semiconductor laser including:
   growing at least two semiconductor layers successively on a substrate, the finally grown layer not containing aluminum and the layer grown immediately before the finally grown layer containing aluminum;
   etching a stripe groove through said finally grown layer to expose part of said layer containing aluminum;
   growing a second layer not containing aluminum on said finally grown layer and the exposed portion of said layer containing aluminum; and
   growing a second layer containing aluminum on said second layer not containing aluminum.

2. The method of claim 1 wherein said second layer not containing aluminum is grown to a thickness larger than 10 nanometers and less than the thickness of said finally grown layer.

3. The method of claim 1 wherein said substrate comprises a first conductivity type GaAs and including growing a first conductivity type $Al_xGa_{1-x}As$ layer as said layer grown immediately before the finally grown layer, growing a GaAs layer of a second conductivity type, different from said first conductivity type, as said finally grown layer, and growing a first conductivity type GaAs layer as said second layer not containing aluminum.

4. The method of claim 3 including growing $Al_yGa_{1-y}As$ as said second layer containing aluminum.

5. A method for producing a semiconductor laser including:
   successively growing on a GaAs substrate of a first conductivity type a first buffer layer of $Al_xGa_{1-x}As$ of said first conductivity type and a current blocking layer of GaAs of a second conductivity type different from said first conductivity type;
   etching a stripe groove through said current blocking layer to expose part of said first buffer layer;
   growing a second buffer layer of GaAs of said first conductivity type on said current blocking layer and the exposed portion of said first buffer layer; and
   successively growing on said second buffer layer a first cladding layer of $Al_yGa_{1-y}As$ of said first conductivity type, an active layer of $Al_zGa_{1-z}As$, and a second cladding layer of $Al_yGa_{1-y}As$ of said second conductivity type.

6. The method of claim 5 wherein said second buffer layer has a thickness larger than 10 nanometers and less than the thickness of said current blocking layer.

* * * * *